US012748249B2

(12) United States Patent
Baek et al.

(10) Patent No.: US 12,748,249 B2
(45) Date of Patent: Sep. 29, 2026

(54) POLARIZING PLATE AND OPTICAL DISPLAY DEVICE COMPRISING SAME

(71) Applicant: SAMSUNG SDI CO., LTD., Yongin-si (KR)

(72) Inventors: Il Woong Baek, Suwon-si (KR); Yeon Ju Jung, Suwon-si (KR); Yoon Jung Kim, Suwon-si (KR); Sung Man Cho, Suwon-si (KR); Ri Ra Jung, Suwon-si (KR); Han Mam Jeong, Suwon-si (KR)

(73) Assignee: HOARDSUN HENGXIN(WUXI) MATERIALS CO., LTD., Wuxi (CN)

( * ) Notice: Subject to any disclaimer, the term of this patent is extended or adjusted under 35 U.S.C. 154(b) by 344 days.

(21) Appl. No.: 18/682,395

(22) PCT Filed: Aug. 1, 2022

(86) PCT No.: PCT/KR2022/011279

§ 371 (c)(1),
(2) Date: Feb. 8, 2024

(87) PCT Pub. No.: WO2023/018080

PCT Pub. Date: Feb. 16, 2023

(65) Prior Publication Data

US 2024/0353602 A1 Oct. 24, 2024

(30) Foreign Application Priority Data

Aug. 13, 2021 (KR) ........................ 10-2021-0107170

(51) Int. Cl.
*G02B 5/30* (2006.01)
*G02B 1/11* (2015.01)
(Continued)

(52) U.S. Cl.
CPC .............. *G02B 5/3016* (2013.01); *G02B 1/11* (2013.01); *G02B 1/14* (2015.01); *H10K 59/8791* (2023.02)

(58) Field of Classification Search
CPC ...... G02B 5/3016; G02B 5/3083; G02B 5/30; H10K 59/8791
(Continued)

(56) References Cited

U.S. PATENT DOCUMENTS 5,999,243 A * 12/1999 Kameyama ....... G02F 1/133536 349/185
2007/0184212 A1* 8/2007 Nimura ............... G02B 5/3033 428/1.31
(Continued)

FOREIGN PATENT DOCUMENTS

JP 2008-003541 A 1/2008
JP 2010-204479 A 9/2010
(Continued)

OTHER PUBLICATIONS

Korean Office Action dated Jul. 22, 2024, issued in corresponding Korean Patent Application No. KR 10-2021-0107170 (5 pages).
(Continued)

*Primary Examiner* — Bumsuk Won
*Assistant Examiner* — Seth D Moser
(74) *Attorney, Agent, or Firm* — Ricky Lam

(57) ABSTRACT

Provided are a polarizing plate and an optical display device comprising the same, the polarizing plate comprising: a polarizer; a protective film laminated on the top surface of the polarizer; and a retardation film laminated on the bottom surface of the polarizer. The retardation film comprises a first retardation layer, and a second retardation layer which is a coating layer formed on one surface of the first retardation layer. The protective film has a total haze of 19% or
(Continued)

more and an internal haze of 7% or more at a wavelength of 550 nm to 555 nm, and the polarizer has a polarization angle of 99.5% or more.

12 Claims, 1 Drawing Sheet

(51) Int. Cl.
*G02B 1/14* (2015.01)
*H10K 59/80* (2023.01)

(58) Field of Classification Search
USPC .......................................... 359/489.07, 489.01
See application file for complete search history.

(56) References Cited

U.S. PATENT DOCUMENTS

| | | | | |
|---|---|---|---|---|
| 2007/0206282 | A1* | 9/2007 | Miyatake | G02B 5/3033 359/489.07 |
| 2009/0103017 | A1 | 4/2009 | Maezawa et al. | |
| 2009/0290100 | A1* | 11/2009 | Haruta | G02B 5/3083 349/194 |
| 2016/0115333 | A1* | 4/2016 | Ito | C09D 101/28 252/582 |
| 2016/0154159 | A1* | 6/2016 | Kim | G02F 1/133634 359/489.07 |
| 2019/0317353 | A1 | 10/2019 | Shim et al. | |
| 2020/0355964 | A1* | 11/2020 | Yonezawa | G02F 1/133504 |
| 2021/0157223 | A1* | 5/2021 | Yaegashi | G02B 5/3083 |

FOREIGN PATENT DOCUMENTS

| | | | |
|---|---|---|---|
| KR | 10-2009-0035442 | A | 4/2009 |
| KR | 10-2010-0058884 | A | 6/2010 |
| KR | 10-2011-0110011 | A | 10/2011 |
| KR | 10-2013-0048829 | A | 5/2013 |
| KR | 10-2018-0088402 | A | 8/2018 |
| KR | 10-2020-0116837 | A | 10/2020 |

OTHER PUBLICATIONS

International Search Report of PCT/KR2022/011279, Nov. 7, 2022, 4pp.

* cited by examiner

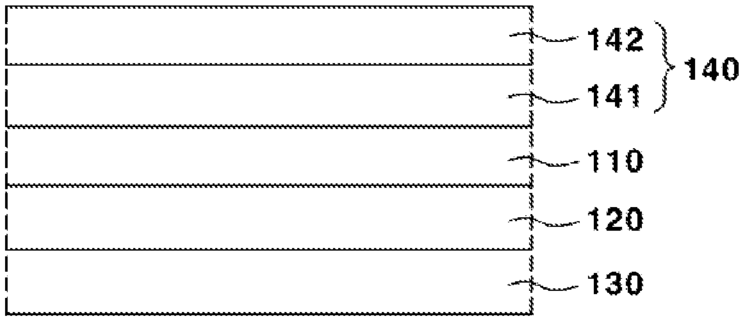
142
141
140
110
120
130

POLARIZING PLATE AND OPTICAL DISPLAY DEVICE COMPRISING SAME

CROSS-REFERENCE TO RELATED APPLICATIONS

This application is a U.S. National Phase Patent Application of International Application Number PCT/KR2022/011279, filed on Aug. 1, 2022, which claims priority to Korean Patent Application Number 10-2021-0107170, filed on Aug. 13, 2021, the entire content of each of which is incorporated herein by reference.

TECHNICAL FIELD

The present invention relates to a polarizing plate and an optical display device including the same.

BACKGROUND ART

Organic light-emitting diode (OLED) display devices each include a polarizing plate on an OLED panel to improve reflection visibility. A polarizing plate may include a polarizer and a retardation film.

A retardation film may include a one-sheet type retardation film for implementing a ¼ retardation or a two-sheet type retardation film including a retardation film for implementing a ½ retardation and a retardation film for implementing a ¼ retardation. Recently, a retardation film having a structure similar to a two-sheet type retardation film has been developed by applying a composition for implementing a retardation on a film for implementing a retardation and performing post-treatment such as stretching. Such a retardation film may include a film for implementing a retardation and a retardation layer in the form of a coating layer for implementing a retardation.

However, since a retardation layer in the form of a coating layer is manufactured through coating and stretching, an abrupt change in retardation may occur in a narrow section of the retardation layer in an in-plane direction. The abrupt change in retardation may vary according to a coating method, viscosity of a composition, and a coating layer substrate during a process of applying a composition. The boundary of the abrupt change in retardation may be visible from the outside and stains may be visible.

Meanwhile, when a polarizing plate is used in an OLED display device, cover glass is stacked on an upper surface of the polarizing plate. The abrupt change in retardation may be visible both before and after the cover glass is stacked.

The background technology of the present invention is disclosed in Korean Patent Publication No. 2010-0058884 and the like.

DISCLOSURE

Technical Problem

The present invention is directed to providing a polarizing plate which prevents an abrupt change in retardation or non-uniformity in retardation due to a retardation film provided with a coating layer from being visible.

The present invention is also directed to providing a polarizing plate which minimizes the visibility of an abrupt change in retardation or non-uniformity in retardation both before and after cover glass is laminated.

Technical Solution

One aspect of the present invention provides a polarizing plate.

The polarizing plate includes a polarizer, a protective film stacked on an upper surface of the polarizer, and a retardation film stacked on a lower surface of the polarizer, wherein the retardation film includes a first retardation layer and a second retardation layer that is a coating layer disposed on one surface of the first retardation layer, the protective film has a total haze of 19% or more and an internal haze of 7% or more at a wavelength of 550 nm to 555 nm, and the polarizer has a polarization degree of 99.5% or more.

In 2.1, the polarizer may have a single transmittance of 44% or more.

In 3.1-2, the protective film may include a protective film substrate and an anti-glare layer stacked on an upper surface of the protective film substrate.

In 4.1-3, the anti-glare layer may include a matrix and particles impregnated in the matrix.

In 5.4, the particles may include silica and the particles may be included in a range of 10 wt % to 50 wt % in the anti-glare layer.

In 6.1-5, the retardation film may have a total haze of 0.1% to 1%.

In 7.1-6, the second retardation layer may have at least a retardation change area in which a difference of an in-plane retardation is 10 nm or less at a wavelength of 550 nm as compared with a surrounding area in an in-plane direction.

In 8.1-7, the second retardation layer may include at least one of a cellulose ester-based polymer and a polystyrene-based polymer.

In 9.1-8. the second retardation layer may have a slow axis of +79° to +89° or −89° to −79° with respect to a machine direction (MD) of the first retardation layer.

In 10.1-9, the protective film may have a higher internal haze than the retardation film at a wavelength of 550 nm.

In 1.10, a difference in internal haze between the protective film and the retardation film may be in a range of 6% to 17%.

In 12.1-11, the first retardation layer may have an in-plane retardation of 200 nm to 270 nm at a wavelength of 550 nm, and the second retardation layer may have an in-plane retardation of 80 nm to 140 nm at a wavelength of 550 nm.

13.1-11, the first retardation layer and the second retardation layer may be sequentially stacked from the polarizer.

Another aspect of the present invention provides an optical display device.

The optical display device may include the polarizing plate of the present invention.

Advantageous Effects

The present invention provides a polarizing plate which prevents an abrupt change in retardation or non-uniformity in retardation due to a retardation film provided with a coating layer from being visible.

The present invention provides a polarizing plate which minimizes the visibility of an abrupt change in retardation or non-uniformity in retardation both before and after cover glass is laminated.

DESCRIPTION OF DRAWINGS

FIG. 1 is a cross-sectional view of a polarizing plate according to one embodiment of the present invention.

BEST MODES OF THE INVENTION

Embodiments of the present invention will be described in detail with reference to the accompanying drawings such that the present invention can be easily implemented by those skilled in the art. It should be understood that the present invention may be embodied in different ways and is not limited to the following embodiments.

In order to clearly describe the present invention in the drawings, portions not related to the description will be omitted. Like components will be denoted by like reference numerals throughout the specification. The length and size of each component in the drawings are only for describing the present invention, and the present invention is not limited to the length and size of each component illustrated in the drawings.

In the present specification, "upper" and "lower" are defined with reference to the accompanying drawings, and "upper" may be changed into "lower," and "lower" may be changed into "upper" depending on the viewpoint.

In the present specification, "in-plane retardation Re" may be represented by Equation A, "thickness direction retardation Rth" may be represented by Equation B, and "degree of biaxiality NZ" may be represented by Equation C below:

$$Re=(nx-ny)\times d \quad \text{Equation A}$$

$$Rth=((nx+ny)/2-nz)\times d \quad \text{Equation B}$$

$$NZ=(nx-nz)/(nx-ny) \quad \text{Equation C}$$

In Equations A to C, nx, ny, and nz are refractive indices in a slow axis direction, a fast axis direction, and a thickness direction of an optical element at a measurement wavelength, respectively, and d is a thickness of the optical element (unit: nm). In Equations A to C, the measurement wavelength may be 450 nm, 550 nm, or 650 nm. The slow axis is an axis with a relatively high refractive index in an in-plane direction, and the fast axis is an axis with a relatively low refractive index in the in-plane direction.

In the present specification, "short wavelength dispersion" is Re(450)/Re(550), and "long wavelength dispersion" is Re(650)/Re(550). Re(450), Re(550), and Re(650) are in-plane retardations Re at wavelengths of 450 nm, 550 nm, and 650 nm of a retardation layer alone or a retardation layer stack, respectively.

In the present specification, "(meth)acrylic" may refer to acrylic and/or methacrylic.

In the present specification, for "internal haze," a film was cut to 10 cm wide×10 cm long to provide a film specimen, two glass plates having a thickness of 0.5 T and one surface coated with glycerin with a haze of 0 were provided, a film was stacked on the glycerin-coated surface of the glass plate to planarize an uneven surface, and a glass plate, glycerin, a film specimen, glycerin, and a glass plate were sequentially stacked to manufacture a specimen in which the glass plate was is in close contact with both surfaces of the film. Haze 1 was measured on the manufactured specimen. Without the film, a glass plate, glycerin with a haze of 0, and a glass plate were sequentially stacked to manufacture a specimen in which the glass plates were in close contact with each other without a film, and haze 2 was measured on the specimen. Internal haze is a value measured by subtracting haze 2 from haze 1. Haze may be measured using a haze meter (for example, NDH2000).

In the present specification, "total haze" is the sum of the internal haze of a film and the external haze of the film. The "total haze" may be a value obtained by cutting a film to 10 cm wide×10 cm long to manufacture a specimen and measuring the specimen using a haze meter (NDH2000).

In the present specification, "internal haze" and "total haze" may be values measured at a wavelength of 550 nm to 555 nm.

As used herein to represent an angle, "+" means an angle in a counterclockwise direction with respect to a reference point, and "−" means an angle in a clockwise direction with respect to the reference point.

As used herein to represent a numerical range, the expression "X to Y" means "greater than or equal to X and less than or equal to Y (X≤ and ≤Y)."

A polarizing plate of the present invention includes a retardation film including a second retardation layer, which is a coating layer, on one surface of a first retardation layer. The visibility of an abrupt change in retardation and non-uniformity in retardation due to the coating layer was minimized, and the visibility of the abrupt change in retardation was minimized both before and after cover glass was laminated on an upper surface of the polarizing plate (surface of the polarizing plate on which external light is incident).

The polarizing plate of the present invention includes a polarizer, a protective film stacked on an upper surface of the polarizer, and a retardation film stacked on a lower surface of the polarizer, wherein the retardation film includes the first retardation layer and the second retardation layer, which is the coating layer, disposed on one surface of the first retardation layer. The protective film has a total haze of 19% or more and an internal haze of 7% or more at a wavelength of 550 nm to 555 nm, and the polarizer has a polarization degree of 99.5% or more.

The polarizing plate of the present invention can be used as an anti-reflection polarizing plate for light-emitting display devices including organic light-emitting display devices.

Hereinafter, a polarizing plate of one embodiment of the present invention will be described with reference to FIG. 1.

Referring to FIG. 1, the polarizing plate includes a polarizer (110), a protective film (140) stacked on an upper surface of the polarizer (110), and a retardation film stacked on a lower surface of the polarizer (110).

Retardation Film

The retardation film includes a first retardation layer (120) and a second retardation layer (130) sequentially stacked from the polarizer (110).

In one embodiment, the retardation film may be a two-layer retardation layer stack of the first retardation layer (120) and the second retardation layer (130).

In the present invention, the retardation film is not a film manufactured by laminating the first retardation layer (120) and the second retardation layer (130) with a bonding agent, an adhesive, or the like. Instead, the second retardation layer (130) is formed directly on the first retardation layer (120) in the form of a coating layer. Thus, the retardation film and the polarizing plate may be implemented to be thinner. "Directly formed" means that an arbitrary bonding agent layer or adhesive layer is not provided between the first retardation layer (120) and the second retardation layer (130).

First, a method of manufacturing a retardation film will be described in detail.

A retardation film may be manufactured by applying a composition for a second retardation layer on an unstretched or obliquely stretched film for a first retardation layer to form a coating layer for a second retardation layer, and stretching the entirety of the film for the first retardation layer and the coating layer for the second retardation layer in a machine direction (MD) or an oblique direction with respect to an MD of the film for the first retardation layer. Preferably, in the retardation film, the composition for the second retardation layer may be applied on the obliquely stretched film for the first retardation layer to form the coating film for the second retardation layer, and the entirety of the formed coating film may be stretched in the MD direction to implement a retardation between the first retardation layer and the second retardation layer to be described in detail below.

The film for the first retardation layer may be a non-liquid crystal layer and may include a film formed of an optically transparent resin. The "non-liquid crystal layer" may be a layer that is not formed of at least one of a liquid crystal monomer, a liquid crystal oligomer, and a liquid crystal polymer or a layer that is formed of a material that is not converted into a liquid crystal monomer, a liquid crystal oligomer, or a liquid crystal polymer by light irradiation or the like.

The film for the first retardation layer may include a resin having positive (+) birefringence. "Positive (+) birefringence" refers to a characteristic in which a refractive index increases in a stretching direction in a transparent film to which birefringence properties are imparted through stretching.

For example, the film for the first retardation layer may be a film formed of at least one of a cellulose-based resin including triacetylcellulose or the like, a polyester-based resin including polyethylene terephthalate (PET), polybutylene terephthalate, polyethylene naphthalate, polybutylene naphthalate, or the like, a cyclic polyolefin (COP)-based resin, a polycarbonate-based resin, a polyethersulfone-based resin, a polysulfone-based resin, a polyamide-based resin, a polyimide-based resin, a polyolefin-based resin, a polyarylate-based resin, a polyvinylalcohol-based resin, a polyvinyl chloride-based resin, and a polyvinylidene chloride-based resin. Preferably, the film for the first retardation layer may include a cyclic polyolefin-based film so that it is easy to secure the following short wavelength dispersion and long wavelength dispersion. The cyclic polyolefin-based film can provide an effect of improving front reflectance in the polarizing plate of the present invention.

Before the composition for the second retardation layer is applied, the film for the first retardation layer may be in an unstretched state or may be obliquely stretched at a certain stretching ratio. The first retardation layer may be formed by stretching an unstretched film formed of an optically transparent resin and may be later stacked on a polarizer through roll-to-roll to make it possible to manufacture a polarizing plate, thereby improving processability.

Hereinafter, the composition for the second retardation layer will be described.

The composition for the second retardation layer may include a resin having negative (−) birefringence. "Negative (−) birefringence" refers to a characteristic in which a refractive index increases in a direction perpendicular to a stretching direction in a transparent film to which birefringence properties are imparted through stretching.

The second retardation layer may become a non-liquid crystal layer. When the second retardation layer is formed of a liquid crystal, an alignment layer necessary to orient the liquid crystal at a certain angle should be included in the polarizing plate, and foreign materials may be easily generated in the alignment layer. The composition for the second retardation layer may be non-liquid crystalline and may include at least one of a cellulose ester-based polymer and a polystyrene-based polymer.

Hereinafter, a cellulose ester-based polymer will be described.

In the present specification, "polymer" is used with a meaning including an oligomer, a polymer, or a resin.

As represented by Formula 1, the cellulose ester-based polymer may include an ester polymer in which at least a portion of a hydroxyl group [a C2 hydroxyl group, a C3 hydroxyl group, or a C6 hydroxyl group] of a sugar monomer constituting cellulose has an unsubstituted or substituted acyl unit.

Formula 1

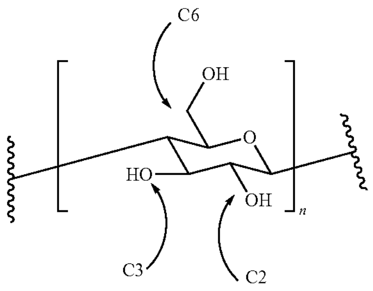

In Formula 1 above, n is an integer of 1 or more.

Substituents of the cellulose ester-based polymer may each include at least one of a halogen, nitro, alkyl (for example, a C1-C20 alkyl group), alkenyl (for example, a C1-C20 alkenyl group), cycloalkyl (for example, a C3-C10 cycloalkyl group), aryl (for example, a C6-C20 aryl group), heteroaryl (for example, a C3-C10 heteroaryl group), alkoxy (for example, a C1-C20 alkoxy group), acyl, and a halogen-containing functional group. The substituents may be the same or different.

As well-known to those skilled in the art, the "acyl" may be RC(═O)—* (* is a connecting symbol, and R is a C1-C20 alkyl group, a C3-C20 cycloalkyl, a C6-C20 aryl, or a C7-C20 arylalkyl). The "acyl" is bonded to a ring of cellulose through an ester bond (an oxygen atom) in the cellulose.

For convenience, the "alkyl," "alkenyl," "cycloalkyl," "aryl," "heteroaryl," "alkoxy," and "acyl" are each a non-halogen-based material that does not include a halogen. The composition for the second retardation layer may include a cellulose ester-based material alone or a mixture of a cellulose ester-based material.

"Halogen" refers to fluorine (F), Cl, Br, or I, preferably F.

The "halogen-containing functional group" may be an organic functional group containing one or more halogens and may include an aromatic, aliphatic, or alicyclic functional group. For example, the halogen-containing functional group may be a halogen-substituted C1-C20 alkyl group, a halogen-substituted C2-C20 alkenyl group, a halogen-substituted C2-C20 alkynyl group, a halogen-substituted C3-C10 cycloalkyl group, a halogen-substituted C1-C20 alkoxy group, a halogen-substituted acyl group, a halogen-substituted C6-C20 aryl group, or a halogen-substituted C7-C20 arylalkyl group, but the present invention is not limited thereto.

The "halogen-substituted acyl group" may be R'—C(═O)—* (* is a halogen-substituted connecting symbol, and R' is a halogen-substituted C1-C20 alkyl group, a halogen-substituted C3-C20 cycloalkyl, a halogen-substituted C6-C20 aryl, or a C7-C20 arylalkyl). The "halogen-substituted acyl group" may be bonded to a ring of cellulose through an ester bond (an oxygen atom) in the cellulose.

Preferably, the composition for the second retardation layer may include a cellulose ester-based polymer substituted with an acyl, a halogen, or a halogen-containing functional group. More preferably, the halogen may be fluorine. The halogen may be included in a range of 1 wt % to 10 wt % in the cellulose ester-based polymer. In such a range, a second retardation layer having the properties of the present invention can be easily manufactured, and a circular polarization degree (ellipticity) can be further increased.

The cellulose ester-based polymer may be prepared through a common method known to those skilled in the art, or used to manufacture the second retardation layer by a commercially available product being purchased. For example, the cellulose ester-based polymer having acyl as a substituent may be prepared by reacting trifluoroacetic acid or trifluoroacetic anhydride or by reacting trifluoroacetic acid or trifluoroacetic anhydride with a sugar monomer or a polymer of the sugar monomer constituting the cellulose of Formula 1 and then additionally reacting an acylating agent (for example, an anhydride of carboxylic acid or carboxylic acid), or by reacting trifluoroacetic acid or trifluoroacetic anhydride and an acylating agent together.

The polystyrene-based polymer may include a moiety of Formula 2:

Formula 2

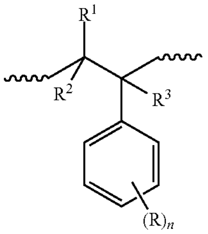

In Formula 2 above,  is a linking site of an element, $R^1$, $R^2$, and $R^3$ are each independently a hydrogen atom, an alkyl group, a substituted alkyl group, or a halogen, Rs are each independently a substituent on a styrene ring, and n is an integer from 0 to 5 indicating the number of substituents on the styrene ring.

Examples of the substituent R on the styrene ring and a substituent of the "substituted alkyl group" may include an alkyl, substituted alkyl, halogen, hydroxy, carboxy, nitro, alkoxy, amino, sulfonate, phosphate, acyl, acyloxy, phenyl, alkoxycarbonyl, cyano, and the like.

In one embodiment, at least one of $R^1$, $R^2$, and $R^3$ may be a halogen, more preferably, fluorine.

The composition for the second retardation layer may further include an additive having an aromatic fused ring in addition to the above-described cellulose ester-based polymer or polystyrene-based polymer. The additive having the aromatic fused ring may serve to adjust wavelength dispersion. The additive having the aromatic fused ring may include 2-naphthylbenzoate, anthracene, phenanthrene, 2,6-naphthalenedicarboxylic acid diester, or the like. The additive having the aromatic fused ring may be included in a range of 0.1 wt % to 30 wt %, or preferably in a range of 1 wt % to 10 wt % in the composition for the second retardation layer. In such a range, there is an effect of adjusting a retardation expression rate and wavelength dispersion.

The composition for the second retardation layer may further include common additives known to those skilled in the art. The additives may include pigments, antioxidants, and the like, but the present invention is not limited thereto.

The composition for the second retardation layer may be applied on the film for the first retardation layer through a certain coating method. For example, the composition for the second retardation layer may be applied through a method including die coating, spin coating, or bar coating, but the present invention is not limited thereto.

All of the film for the first retardation layer and the coating film for the second retardation layer may be stretched in an MD or an oblique direction with respect to the MD of the film for the first retardation layer, thereby implementing a retardation of the first retardation layer and a retardation of the second retardation layer which will be described in detail below. In one embodiment, all of the film for the first retardation layer and the coating film for the second retardation layer may be stretched to 1.1 times to 2.1 times the original length thereof, specifically, 1.3 times to 1.8 times. Thus, with respect to the MD (0°) of the first retardation layer, a slow axis of the second retardation layer may have an angle of +79° to +89° or −79° to −89°, specifically, an angle of +79°, +80°, +81°, +82°, +83°, +84°, +85°, +86°, +87°, +88°, +89°, −89°, −88°, −87°, −86°, −85°, −84°, −83°, −82°, −81°, −80°, or −79°, or preferably an angle of +81° to +87° or −81° to −87°.

As described above, the second retardation layer is manufactured through coating and by stretching the coating film for the second retardation layer and thus has an abrupt change in retardation in a narrow section in an in-plane direction of the second retardation layer. The abrupt change in retardation may be visible from outside the polarizing plate. In addition, the abrupt change in retardation may be visible both before and after cover glass is laminated on an upper surface of the polarizing plate.

In one embodiment, in the second retardation layer, at least a retardation change area may be present in which, as compared with a surrounding area, a difference of an in-plane retardation at a wavelength of 550 nm in an in-plane direction is 10 nm or less, specifically more than 0 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, or 10 nm, preferably more than 0 nm and 5 nm or less, or more specifically more than 0 nm and 3 nm or less. A plurality of retardation change areas may be present in the in-plane direction of the second retardation layer. The retardation change area may have a circular, semicircular, oval, amorphous, or polygonal shape, but the present invention is not limited thereto.

The second retardation layer manufactured with an abrupt change in retardation change and through above described manufacturing method may have an internal haze of 0% to 1%, specifically 0%, 0.5%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, or 1%, or preferably 0% to 0.2%.

The first retardation layer (120) may have an in-plane retardation of 200 nm to 270 nm at a wavelength of 550 nm. In such a range, reflectance at both the front and the side can be reduced, and visibility of black at the front may be improved to assist in improving screen quality. Specifically, an in-plane retardation of the first retardation layer (120) at a wavelength of 550 nm may be 200 nm, 205 nm, 210 nm, 215 nm, 220 nm, 225 nm, 230 nm, 235 nm, 240 nm, 245 nm, 250 nm, 255 nm, 260 nm, 265 nm, or 270 nm, or preferably in a range of 200 nm to 260 nm or 245 nm to 255 nm.

The first retardation layer (120) may have positive wavelength dispersion. The positive wavelength dispersion means that short wavelength dispersion>long wavelength dispersion. The first retardation layer (120) may have a short wavelength dispersion of 1 to 1.1 and a long wavelength dispersion of 0.96 to 1. In such a range, reflectance can be lowered at the front and the side when the polarizing plate is used. Specifically, the short wavelength dispersion of the first retardation layer (120) may be more than 1, 1.01, 1.02, 1.03, 1.04, 1.05, 1.06, 1.07, 1.08, 1.09, or 1.1, or preferably in a range of more than 1 to 1.1 or more than 1 to 1.03, and the long wavelength dispersion thereof may be 0.96, 0.97, 0.98, 0.99, or 1, or preferably in a range of 0.98 to 1 or 0.99 to 1.

In one embodiment, an in-plane retardation of the first retardation layer (120) at a wavelength of 450 nm may be in a range of 180 nm to 280 nm, preferably 185 nm to 275 nm, or more preferably 190 nm to 270 nm, and an in-plane retardation thereof at a wavelength of 650 nm may be in a range of 175 nm to 270 nm, preferably 180 nm to 265 nm, or preferably 185 nm to 260 nm. In such a range, the short wavelength dispersion and the long wavelength dispersion of the first retardation layer can be easily achieved.

A thickness direction retardation of the first retardation layer (120) at a wavelength of 550 nm may have a positive (+) value and may be in a range of 100 nm to 200 nm, specifically 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm, or preferably in a range of 110 nm to 190 nm or 120 nm to 180 nm. In such a range, there may be an effect of improving side reflectance.

A thickness of the first retardation layer (120) may be in a range of 20 μm to 70 μm, specifically 20 μm, 30 μm, 40 μm, 50 μm, 60 μm, or 70 μm, or preferably in a range of 30 μm to 60 μm. In such a range, the first retardation layer 120 may be used in the polarizing plate.

A total haze of the first retardation layer (120) at a wavelength of 550 nm may be 0.5% or less, specifically 0%, 0.05%, 0.1%, 0.15%, 0.2%, 0.25%, 0.3%, 0.35%, 0.4%, 0.45%, or 0.5%, or preferably in a range of 0% to 0.1%. In such a range, it is possible to assist in preventing an abrupt change in retardation due to the second retardation layer from being visible.

In a case in which the first retardation layer is an obliquely stretched film, a slow axis of the first retardation layer has an angle in a certain range with respect to a light absorption axis of the polarizer, thereby lowering reflectance at both the front and the side and increasing ellipticity at the side.

An absolute value of an angle (α1) formed by the slow axis of the first retardation layer with respect to the light absorption axis of the polarizer (110) is in a range of 10° to 30°. The first retardation layer is tilted in such a range to satisfy a certain angle together with a slow axis of the second retardation layer, thereby lowering reflectance at both the front and the side. Specifically, the absolute value of the angle (α1) may be 10°, 11°, 12°, 13°, 14°, 15°, 16°, 17°, 18°, 19°, 20°, 21°, 22°, 23°, 24°, 25°, 26°, 27°, 28°, 29°, or 30°, preferably in a range of 12° to 28°, or more preferably in a range of 15° to 25°.

Although not shown in FIG. 1, the first retardation layer (120) may be attached to the polarizer (110) by a first adhesive layer. The first adhesive layer may be formed of, for example, at least one of a water-based adhesive and a photocurable adhesive. Preferably, the first adhesive layer may be formed of a photocurable adhesive, and thus adhesion between the protective film and the polarizer and adhesion between the polarizer and the first retardation layer can be achieved through one irradiation of light, thereby improving a manufacturing process of the polarizing plate.

The second retardation layer (130) may have an in-plane retardation of 80 nm to 140 nm at a wavelength of 550 nm. In such a range, reflectance at both the front and the side can be reduced to assist in improving screen quality. Specifically, an in-plane retardation of the second retardation layer (130) at a wavelength of 550 nm may be 80 nm, 85 nm, 90 nm, 95 nm, 100 nm, 105 nm, 110 nm, 115 nm, 120 nm, 125 nm, 130 nm, 135 nm, or 140 nm, or preferably in a range of 80 nm to 130 nm, 100 nm to 120 nm, or 109 nm to 119 nm.

The second retardation layer (130) may have a short wavelength dispersion of 1 to 1.15 and a long wavelength dispersion of 0.90 to 1, as a positive wavelength dispersion. In such a range, a difference in wavelength dispersion as compared with the first retardation layer is reduced, thereby increasing a circular polarization degree for each wavelength to improve reflection performance. Specifically, the short wavelength dispersion of the second retardation layer may be 1, more than 1, 1.1, 1.11, 1.12, 1.13, 1.14, or 1.15, or preferably in a range of 1 to 1.12, and a long wavelength dispersion thereof may be 0.90, 0.91, 0.92, 0.93, 0.94, 0.95, 0.96, 0.97, 0.98, 0.99, or more than 1, 1, or preferably in a range of 0.91 to 0.99.

In one embodiment, an in-plane retardation of the second retardation layer (130) at a wavelength of 450 nm may be in a range of 80 nm to 160 nm, preferably in a range of 85 nm to 135 nm, or more preferably in a range of 90 nm to 130 nm, and an in-plane retardation thereof at a wavelength of 650 nm may be in a range of 80 nm to 140 nm, or preferably in a range of 80 nm to 125 nm. In such a range, a short wavelength dispersion and a long wavelength dispersion of the second retardation layer can be easily achieved.

A thickness direction retardation of the second retardation layer (130) at a wavelength of 550 nm may have a negative (−) value and may be in a range of −250 nm to −40 nm, specifically −250 nm, −240 nm, −230 nm, −220 nm, −210 nm, −200 nm, −190 nm, −180 nm, −170 nm, −160 nm, −150 nm, −140 nm, −130 nm, −120 nm, −110 nm, −100 nm, −90 nm, −80 nm, −70 nm, −60 nm, −50 nm, or −40 nm, or preferably in a range of −250 nm to −50 nm or −150 nm to −60 nm. In such a range, a circular polarization degree with respect to the side may increase, which may have an effect on side reflectance.

A refractive index of the second retardation layer (130) may be in a range of 1.4 to 1.6, specifically 1.4, more than 1.4, 1.5, or 1.6, or preferably in a range of 1.5 to 1.6. In such a range, a refractive index with respect to the first retardation layer may be controlled, which may have an effect of increasing transparency.

An absolute value of an angle (α2) formed by the slow axis of the second retardation layer with respect to the light absorption axis of the polarizer (110) is in a range of 79° to 89°. The second retardation layer is tilted in such a range to satisfy a certain angle together with the light absorption axis of the polarizer, thereby lowering reflectance at both the front and the side. Specifically, the absolute value of the angle (α2) may be 79°, 80°, 81°, 82°, 83°, 84°, 85°, 86°, 87°, 88°, or 89°, or preferably in a range of 79° to 89°.

In one embodiment, the angle (α1) may be in a range of +10° to +30°, and the angle (α2) may be in a range of +79° to +89°. In another embodiment, the angle (α1) may be in a range of −10° to −30°, and the angle (α2) may be in a range of −79° to −89°.

In one embodiment, the angle formed by the slow axis of the first retardation layer (120) and the slow axis of the second retardation layer (130) may be in a range of 50° to 70°, specifically 50°, 51°, 52°, 53°, 54°, 55°, 56°, 57°, 58°, 59°, 60°, 61°, 62°, 63°, 64°, 65°, 66°, 67°, 68°, 69°, or 70°, preferably in a range of 57° to 70°, or more preferably in a range of 57° to 67°. In such a range, there may be an effect of increasing a front circular polarization degree.

A thickness of the second retardation layer (130) may be in a range of 1 μm to 15 μm, specifically 1 μm, 2 μm, 3 μm, 4 μm, 5 μm, 6 μm, 7 μm, 8 μm, 9 μm, 10 μm, 11 μm, 12 μm, 13 μm, 14 μm, or 15 μm, or preferably in a range of 4 μm to 12 μm. In such a range, a uniform thickness direction retardation can be well exhibited over the entire width of the second retardation layer, and an effect of thinning the polarizing plate can be obtained.

In order to secure the above-described in-plane retardation at a wavelength of 550 nm, the second retardation layer (130) may include a coating layer, which is formed of a composition for a second retardation layer to be described in detail below, as a non-liquid crystal layer.

Although not shown in FIG. 1, a bonding agent layer or an adhesive layer may be formed on a lower surface of the second retardation layer (130) so that the polarizing plate may be stacked on an element of an optical display device, for example, a light-emitting element panel.

An in-plane retardation of the retardation film, which includes the second retardation layer and the first retardation layer, at a wavelength of 550 nm may be in a range of 120 nm to 200 nm, specifically 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm, or preferably in a range of 140 nm to 180 nm. In such a range, reflectance can be lowered, and a circular polarization degree can be increased.

A thickness of the retardation film may be in a range of 10 μm to 80 μm, or specifically in a range of 30 μm to 60 μm or 48 μm to 60 μm. In such a range, an effect of thinning the polarizing plate can be implemented.

An internal haze of the retardation film, which includes the second retardation layer and the first retardation layer manufactured with an abrupt change in retardation through such a manufacturing method, may be in a range of 0% to 1%, specifically 0%, more than 0%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, or 0.95%, less than 1%, or 1%, or preferably in a range of 0% to 0.2%, and a total haze thereof may be in a range of 0.1% to 1%, specifically 0%, more than 0%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, or 0.95%, less than 1%, or 1%, or preferably in a range of 0.1% to 0.5%.

Protective Film

The protective film (140) may be formed on the upper surface of the polarizer (110), thereby protecting the polarizer from the external environment and further obtaining an effect of increasing the mechanical strength of the polarizing plate.

In the polarizing plate provided with the retardation film including the second retardation layer and the first retardation layer having the abrupt change in retardation, the protective film (140) may prevent an abrupt change in retardation due to the second retardation layer from being visible and may prevent the abrupt change in retardation from being visible both before and after the cover glass is laminated on the upper surface of the polarizing plate, that is, an upper surface of the protective film.

At a wavelength of 550 nm to 555 nm, an internal haze of the protective film (140) is 7% or more, and a total haze thereof is 19% or more. In such a range, it is possible to prevent an abrupt change in retardation from being visible and to prevent the abrupt change in retardation from being visible both before and after the cover glass is laminated on the upper surface of the polarizing plate, that is, the upper surface of the protective film.

Preferably, the internal haze of the protective film (140) may be 7%, more than 7%, 7.5%, 8%, 8.5%, 9%, 9.5%, 10%, 10.5%, 11%, 11.5%, or 12%, or preferably in a range of 7% to 12%, and a total haze thereof may be 19%, more than 19%, 19.5%, 20%, 20.5%, 21%, 21.5%, 22%, 22.5%, 23%, 23.5%, 24%, 24.5%, 25%, 25.5%, 26%, 26.5%, or 27%, or preferably in a range of 19% to 27%. In such a range, the effects of the present invention can be further improved.

The protective film (140) may have a higher internal haze as compared with the retardation film, and an internal haze difference between the protective film (140) and the retardation film may be in a range of 6% to 17%, specifically 6%, more than 6%, 6.5%, 7%, 7.5%, 8%, 8.5%, 9%, 9.5%, 10%, 10.5%, 11%, 11.5%, 12%, 12.5%, 13%, 13.5%, 14%, 14.5%, 15%, 15.5%, 16%, 16.5%, or 17%, or preferably in a range of 6% to 14%. In such a range, the effects of the present invention can be better implemented.

The protective film (140) may include a protective film substrate (141) and a surface treatment layer (142) stacked on an upper surface of the protective film substrate (141), and the surface treatment layer may include an anti-glare (AG) layer.

The protective film substrate (141) may be an optically transparent film which protects the polarizer from the external environment. For example, the protective film substrate (141) may be a film formed of at least one resin of a cellulose-based resin including triacetylcellulose (TAC) or the like, a polyester-based resin including PET, polybutylene terephthalate, polyethylene naphthalate, polybutylene naphthalate, or the like, a COP-based resin, a polycarbonate-based resin, a polyethersulfone-based resin, a polysulfone-based resin, a polyamide-based resin, a polyimide-based resin, a polyolefin-based resin, a polyarylate-based resin, a polyvinyl alcohol-based resin, a polyvinyl chloride-based resin, and a polyvinylidene chloride-based resin. Specifically, a TAC or PET film may be used.

The protective film substrate (141) may have a lower internal haze than the protective film (140), and specifically, the internal haze thereof may be 0.5% or less, specifically 0%, more than 0%, 0.05%, 0.1%, 0.15%, 0.2%, 0.25%, 0.3%, 0.35%, 0.4%, 0.45%, or 0.5%, or preferably in a range of 0% to 0.2%.

The anti-glare layer (142) may include a matrix and particles impregnated in the matrix, and the particles may include at least one of inorganic particles and organic particles.

The particles may include particles that have a different refractive index from the matrix. Preferably, the particles may include silica. The particles may be spherical and may have an average particle diameter (D50) of 2 μm to 5 μm, or specifically in a range of 3 μm to 4 μm. In such a range, the particles may be included in the anti-glare layer and may not affect the anti-reflection performance of the polarizing.

The particles may be included in the anti-glare layer in a range of 10 wt % to 50 wt %, specifically 10 wt %, 13 wt %, 15 wt %, 17 wt %, 20 wt %, 23 wt %, 25 wt %, 27 wt %, 30 wt %, 33 wt %, 35 wt %, 37 wt %, 40 wt %, 43 wt %, 45 wt %, 47 wt %, or 50 wt %, or preferably in a range of 15 wt % to 35 wt %. In such a range, the particles may provide an anti-glare effect and may not affect the anti-reflection performance of the polarizing plate.

In one embodiment, the internal haze and external haze of the protective film may be implemented by adjusting the type of particles, the average particle diameter of the particles, and/or the content of the particles in the AG layer described above.

A thickness of the anti-glare layer (142) may be in a range of 3 μm to 7 μm or specifically in a range of 4 μm to 6 μm. In such a range, the anti-glare layer may be included in the polarizing plate.

The protective film (140) may have an in-plane retardation in a certain range to provide an additional function to the polarizing plate.

In one embodiment, the in-plane retardation of the protective film (140) at a wavelength of 550 nm may be in a range of 0 nm to 50 nm, specifically 0 nm, more than 0 nm, 5 nm, 10 nm, 15 nm, 20 nm, 25 nm, 30 nm, 35 nm, 40 nm, 45 nm, or 50 nm, or preferably in a range of 0 nm to 10 nm. In such a range, there may be an effect of protecting a polarizing element without a change in reflection characteristics due to a change in retardation.

In another embodiment, the in-plane retardation of the protective film (140) at a wavelength of 550 nm may be more than 50 nm, specifically more than 50 nm, 100 nm, 500 nm, 1,000 nm, 2,000 nm, 3,000 nm, 4,000 nm, 5,000 nm, 6,000 nm, 7,000 nm, 8,000 nm, 9,000 nm, 10,000 nm, 11,000 nm, 12,000 nm, 13,000 nm, 14,000 nm, or 15,000 nm, or preferably 5,000 nm or more, 8,000 nm or more, 15,000 nm or less, or 13,000 nm or less. In such a range, rainbow mura may not be visible, and there may be an effect of protecting a polarizing element.

A thickness of the protective film (140) may be in a range of 5 μm to 100 μm or specifically in a range of 15 μm to 90 μm, and the protective film (140) may be used in the polarizing plate in such a range.

Although not shown in FIG. 1, the protective film (140) may be bonded to the polarizer (110) through a second adhesive layer. The second adhesive layer may be formed of at least one of a water-based adhesive and a photocurable adhesive. Preferably, the second adhesive layer may be formed of a photocurable adhesive, and thus adhesion between the protective film and the polarizer and adhesion between the polarizer and the first retardation layer can be achieved through one irradiation of light, thereby improving a manufacturing process of the polarizing plate.

A thickness of the second adhesive layer may be in a range of 0.1 μm to 10 μm or specifically in a range of 0.5 μm to 5 μm. In such a range, the second adhesive layer may be used in the polarizing plate.

Polarizer

The polarizer (110) may convert incident natural light or polarized light into linearly polarized light in a specific direction and may be manufactured from a polymer film including a polyvinyl alcohol-based resin as a main component. Specifically, the polarizer (110) may be manufactured by dyeing a polymer film with iodine or a dichroic dye and stretching the polymer film in an MD. Specifically, the polarizer (110) may be manufactured through a swelling process, a dyeing operation, a stretching operation, and a crosslinking operation.

The polarizer (110) has a polarization degree of 99.5% or more. In such a range, it is possible to minimize the visibility of an abrupt change in retardation and/or non-uniformity in retardation due to the coating layer, and it is possible to assist in minimizing the visibility of an abrupt change in retardation both before and after the cover glass is laminated on the upper surface of the polarizing plate. Preferably, the polarization degree may be 99.5%, more than 99.5%, 99.6%, 99.7%, 99.8%, 99.9%, or 100%, or preferably in a range of 99.5% to 100%. In such a range, it is possible to assist in lowering the visibility of a change in retardation in the retardation film.

A single transmittance of the polarizer (110) may be 44% or more, or for example in a range of 44% to 45%. In such a range, anti-reflection performance can be improved when the polarizer (110) is combined with the first retardation layer and the second retardation layer.

A thickness of the polarizer (110) may be in a range of 2 μm to 30 μm, or specifically in a range of 4 μm to 25 μm, and the polarizer 110 may be used in the polarizing plate in such a range.

The polarizer may be manufactured by dyeing a polyvinyl alcohol-based film with at least one dichroic material of iodine and a dichroic dye and stretching the polyvinyl alcohol-based film. More detailed processes of dyeing and stretching follow conventional methods well known to those skilled in the art.

The polyvinyl alcohol-based film may include a film containing a hydrophilic functional group and a hydrophobic functional group. The hydrophobic functional group may be additionally present in addition to a hydroxyl group (OH group) which is a hydrophilic functional group present in the polyvinyl alcohol-based film. The polarizer may be manufactured using the polyvinyl alcohol-based film containing both the hydrophilic functional group and the hydrophobic functional group, and thus the effects of the present invention can be easy to implement.

The hydrophobic functional group is present in at least one of a main chain and a side chain of a polyvinyl alcohol-based resin that constitutes the polyvinyl alcohol-based film. "Main chain" refers to a part that forms a main framework of the polyvinyl alcohol-based resin, and "side chain" refers to a framework connected to the main chain. Preferably, the hydrophobic functional group may be present in the main chain of the polyvinyl alcohol-based resin.

The polyvinyl alcohol-based resin into which the hydrophilic functional group and the hydrophobic functional group are introduced may be prepared by polymerizing at least one monomer of vinyl esters such as vinyl acetate, vinyl formate, vinyl propionate, vinyl butyrate, vinyl pivalate, and isopropenyl acetate with a monomer providing a hydrophobic functional group. Preferably, the monomer of the vinyl ester may include vinyl acetate. The monomer providing the hydrophobic functional group may include a monomer providing a hydrocarbon repeating unit which includes ethylene, propylene, or the like.

The polyvinyl alcohol-based film containing the hydrophilic functional group and the hydrophobic functional group may allow a thin polarizer to be manufactured. Even when the retardation film with an abrupt change in retardation is stacked on the lower surface of the polarizer, the protective film may have an internal haze of 7% or more and a total haze of 19% or more so that an effect of thinning the polarizer can be implemented while an abrupt change in retardation can be prevented from being visible.

The polarizing plate of the present invention may further include a third retardation layer to be described in detail below.

Hereinafter, a polarizing plate of another embodiment of the present invention will be described.

The polarizing plate includes a protective film, a polarizer, a third retardation layer, a first retardation layer, and a second retardation layer. The polarizing plate is substantially the same as the polarizing plate of FIG. 1, except that the third retardation layer is additionally formed between the polarizer and the first retardation layer.

The third retardation layer is additionally formed between the polarizer and the first retardation layer, thereby further implementing an effect of improving side reflectance.

The third retardation layer includes a positive C layer satisfying nz>nx≈ny, wherein nx, ny, and nz are refractive indices at a wavelength of 550 nm in a slow axis direction, a fast axis direction, and a thickness direction of the third retardation layer, respectively.

In one embodiment, a thickness direction retardation of the third retardation layer at a wavelength of 550 nm may be in a range of −300 nm to 0 nm, or for example in a range of −200 nm to −30 nm. An in-plane retardation of the third retardation layer at a wavelength of 550 nm may be in a range of 0 nm to 10 nm, or for example in a range of 0 nm to 5 nm. In such a range, it is possible to implement an effect of reducing the above-described front reflectance.

In one embodiment, the third retardation layer may be formed as a liquid crystal layer. The liquid crystal layer may be formed of a commonly known material to implement the above-described thickness direction retardation.

In another embodiment, the third retardation layer may be formed of the above-described composition for forming the second retardation layer.

An optical display device of the present invention includes the polarizing plate of the embodiment of the present invention. The optical display device may include an organic light-emitting diode (OLED) display device and a liquid crystal display device.

In one embodiment, the OLED display device may include an OLED panel including a flexible substrate, and the polarizing plate of the present invention stacked on the OLED panel.

In one embodiment, the OLED display device may include an OLED panel including a non-flexible substrate, and the polarizing plate of the present invention stacked on the OLED panel.

MODES OF THE INVENTION

Hereinafter, the configuration and operation of the present invention will be described in more detail through exemplary embodiments of the present invention. However, these embodiments are provided for illustrative purposes only and are not be construed as in any way limiting the invention.

Example 1

Manufacture of Polarizer

A polyvinyl alcohol-based film washed with water (VF-TS #3000 manufactured by Kuraray Co., Ltd., Japan, thickness before stretching: 30 μm, a hydrophobic functional group being contained in a main chain) was subjected to swelling treatment in a water swelling tank at a temperature of 30° C.

The polyvinyl alcohol-based film that had passed through the swelling tank was treated for 200 seconds in a dyeing tank having a temperature of 30° C. and containing an aqueous solution that contained potassium iodide at 3 wt %. The polyvinyl alcohol-based film that had passed through the dyeing tank was allowed to pass through a wet crosslinking tank containing a 30° C. aqueous solution that contained boric acid at 2.5 wt %. The polyvinyl alcohol-based film that had passed through the crosslinking tank was stretched in a wet stretching tank containing a 50° C. aqueous solution that contained boric acid at 2.5 wt % and potassium iodide at 3 wt % such that a total stretching ratio was 6.

The polyvinyl alcohol-based film that had passed through the wet stretching tank was immersed for 100 seconds in a complementary tank including boric acid at 1 wt % and potassium iodide at 5 wt % and having a temperature of 25° C., washed, and dried to manufacture a polarizer (with a thickness of 12 μm, a single transmittance of 44.0%, and a polarization degree of 99.93%).

Manufacture of Retardation Film

A composition for forming a second retardation layer (a non-liquid crystal composition including a cellulose ester polymer (having trifluoroacetyl)) was applied on a lower surface of a COP-based film (ZD film manufactured by Zeon Corporation) stretched in a 45° direction with respect to an MD through a wet coating method to form a coating film for forming a second retardation layer. Trifluoroacetic acid and trifluoroacetic anhydride were added to unsubstituted cellulose, allowed to react with the unsubstituted cellulose, and polymerized to prepare the cellulose ester polymer.

After the coating film was dried, a stack of the coating film and the COP-based film was stretched in the MD to manufacture a retardation film including a first retardation layer (positive wavelength dispersion, Re=250 nm at a wavelength of 550 nm, and thickness: 48 μm) and a second retardation layer (positive wavelength dispersion, Re=114 nm at a wavelength of 550 nm, and thickness: 8 μm). The second retardation layer had an area in which a difference of an in-plane retardation at a wavelength of 550 nm was 10 nm or less as compared with the surrounding area in an in-plane direction. A wavelength dispersion Re of the first retardation layer and the second retardation layer was measured at a wavelength of 550 nm using Axoscan (manufactured by Axometrics, Inc.).

Manufacture of Polarizing Plate

A retardation film was laminated on a lower surface of the manufactured polarizer, and a protective film (AGSR16H-KN(80) manufactured by DNP Co., Ltd., protective film substrate: TEC film), in which an AG layer (including silica beads) was formed on an upper surface, was laminated on an upper surface of the polarizer to manufacture a polarizing plate in which the protective film, the polarizer, and the retardation film were sequentially stacked. Specific specifications of the protective film are shown in Table 1 below.

Example 2

A polarizing plate was manufactured in the same manner as in Example 1, except that manufacturing conditions of a polarizer of Example 1 were changed, and a protective film (AGSR16H-KN(80) manufactured by DNP Co., Ltd., protective film substrate: PET film), in which an AG layer was formed on an upper surface, was used as a protective film.

Examples 3 to 5

Polarizing plates were manufactured in the same manner as in Example 1, except that manufacturing conditions of a polarizer of Example 1 were changed, and a retardation film and/or protective film was changed as shown in Table 1 below.

Comparative Example 1

A polarizing plate was manufactured in the same manner as in Example 1, except that, when a polarizer was manufactured as in Example 1, a polyvinyl alcohol-based film (VF-TS #3000 manufactured by Kuraray Co., Ltd., Japan, thickness before stretching: 30 μm, a hydrophobic functional group not being contained in a main chain) was used, and a protective film was changed as shown in Table 1 below.

Comparative Examples 2 to 4

Polarizing plates were manufactured in the same manner as in Example 1, except that manufacturing conditions of a polarizer of Example 1 were changed, and a retardation film and/or protective film was changed as shown in Table 1 below.

The following physical properties were evaluated on the polarizing plates of the examples and comparative examples and are shown in Table 1 below.

(1) Single transmittance (unit: %) and polarization degree (unit: %) of polarizer: the single transmittance and polarization degree of the polarizers of the examples or comparative examples were measured at a wavelength of 380 nm to 780 nm using a spectrophotometer (V7100 manufactured by JASCO Corporation).

(2) Internal haze (unit: %) and total haze (unit: %) of protective film: the internal haze and total haze of the protective film were measured through a method described above using a haze meter (NDH2000).

(3) Internal haze (unit: %) and total haze (unit: %) of retardation film: the internal haze (unit: %) and total haze of the protective film were measured through the method described above using a haze meter (NDH2000).

(4) Whether abrupt change in retardation is visible before lamination of cover glass: in the polarizing plates of the examples and comparative examples, when the polarizer was viewed with the naked eye from the protective film without lamination of cover glass (glass plate) on the protective film, a degree to which an abrupt change in retardation and non-uniformity in retardation were visible to the naked eye was evaluated. When viewed with the naked eye, a score from 0 to 5 was given according to a degree of visibility of a border between a light portion and a dark portion in a change in retardation. A score of 0 indicates a case in which the boundary between the light portion and the dark portion is not visible, a score of 5 indicates a case in which the boundary between the light portion and the dark portion is strongly visible, and a lower score means that an effect is better.

(5) Whether abrupt change in retardation is visible after lamination of cover glass: the cover glass (glass plate) was laminated on the protective film in the polarizing plates of the examples and comparative examples. Then, evaluation was performed in the same manner as in (4).

(6) Reflectance (unit: %): the polarizing plates manufactured in the examples and comparative examples were stacked on an OLED panel and then measured at an incidence angle of 2° and $3 mm with a C light source in an SCI mode using a spectrophotometer CM-2600D. Measurements were performed three times to obtain an average value.

TABLE 1

| | Polarizer | | Retardation film | | Protective film | | Visibility of retardation change | | |
|---|---|---|---|---|---|---|---|---|---|
| | | | | | | | Before lamination | After lamination | |
| | Single transmittance | Polarization degree | Internal haze | Total haze | Internal haze | Total haze | of cover glass | of cover glass | Reflectance |
| Example 1 | 44.0 | 99.93 | 0.0 | 0.1 | 8.11 | 25.22 | 0 | 2 | 5.1 |
| Example 2 | 44.0 | 99.92 | 0.0 | 0.1 | 7.62 | 24.44 | 0 | 1 | 5.2 |
| Example 3 | 44.0 | 99.92 | 0.1 | 0.2 | 7.01 | 19.33 | 0 | 2 | 5.3 |
| Example 4 | 44.0 | 99.91 | 0.0 | 0.1 | 10.43 | 26.38 | 0 | 1 | 6.5 |
| Example 5 | 44.2 | 99.93 | 0.0 | 0.1 | 11.31 | 26.76 | 0 | 1 | 6.8 |
| Comparative Example 1 | 44.0 | 99.4 | 0.0 | 0.1 | 8.03 | 24.89 | 0 | 4 | 7.5 |
| Comparative Example 2 | 44.0 | 99.90 | 0.0 | 0.1 | 2.79 | 24.31 | 0 | 4 | 4.8 |
| Comparative Example 3 | 44.0 | 99.93 | 0.0 | 0.1 | 6.0 | 18.1 | 2 | 4 | 5.2 |
| Comparative Example 4 | 44.1 | 99.89 | 0.1 | 0.2 | 0.05 | 0.30 | 5 | 5 | 5.2 |

As shown in Table 1, the polarizing plate of the present invention prevents an abrupt change in retardation or non-uniformity in retardation due to the retardation film provided with a coating layer. In addition, in the polarizing plate of the present invention, the visibility of an abrupt change in retardation or non-uniformity in retardation was minimized both before and after the cover glass was laminated.

On the other hand, in the polarizing plate of the comparative examples that did not satisfy the configuration of the present invention, an abrupt change in retardation or non-uniformity in retardation was visible to the naked eye. In addition, in the polarizing plate of the comparative examples that did not satisfy the configuration of the present invention, an abrupt change in retardation or non-uniformity in retardation was visible even before the cover glass was laminated, and even when a change in retardation was not visible before the cover glass was laminated, a change in retardation was severely visible after the cover glass was laminated.

A simple modification or change of the present invention may be easily implemented by a person having ordinary skill in the art, and it is obvious that such modification or change may belong to the scope of the present invention.

The invention claimed is:

1. A polarizing plate comprising:

a polarizer;

a protective film stacked on an upper surface of the polarizer; and a retardation film stacked on a lower surface of the polarizer, wherein the retardation film includes a first retardation layer and a second retardation layer that is a coating layer disposed on one surface of the first retardation layer, the protective film has a total haze of 19% or more and an internal haze of 7% or more, at a wavelength of 550 nm to 555 nm, and the polarizer has a polarization degree of 99.5% or more;

wherein the polarizing plate satisfies at least one of the following:

the second retardation layer has a slow axis of +79° to +89° or −89° to −79° with respect to a MD of the first retardation layer; and the first retardation layer has an in-plane retardation of 200 nm to 270 nm at a wavelength of 550 nm, and the second retardation layer has an in-plane retardation of 80 nm to 140 nm at a wavelength of 550 nm.

2. The polarizing plate of claim 1, wherein the polarizer has a single transmittance of 44% or more.

3. The polarizing plate of claim 1, wherein the protective film includes a protective film substrate and an anti-glare layer stacked on an upper surface of the protective film substrate.

4. The polarizing plate of claim 3, wherein the anti-glare layer includes a matrix and particles impregnated in the matrix.

5. The polarizing plate of claim 4, wherein the particles include silica and the particles are included in a range of 10 wt % to 50 wt % in the anti-glare layer.

6. The polarizing plate of claim 1, wherein the retardation film has a total haze of 0.1% to 1%.

7. The polarizing plate of claim 1, wherein the second retardation layer has at least a retardation change area in which a difference of an in-plane retardation is 10 nm or less at a wavelength of 550 nm as compared with a surrounding area in an in-plane direction.

8. The polarizing plate of claim 1, wherein the second retardation layer includes at least one of a cellulose ester-based polymer and a polystyrene-based polymer.

9. The polarizing plate of claim 1, wherein the protective film has a higher internal haze than the retardation film at a wavelength of 550 nm.

10. The polarizing plate of claim 1, wherein a difference in internal haze between the protective film and the retardation film is in a range of 6% to 17%.

11. The polarizing plate of claim 1, wherein the first retardation layer and the second retardation layer are sequentially stacked from the polarizer.

12. An optical display device comprising the polarizing plate of claim 1.

* * * * *